(12) United States Patent
Nishioka et al.

(10) Patent No.: US 9,602,789 B2
(45) Date of Patent: Mar. 21, 2017

(54) DISPLAY AND PORTABLE PROJECTOR

(71) Applicant: Funai Electric Co., Ltd., Daito, Osaka (JP)

(72) Inventors: Ken Nishioka, Kawachinago (JP); Atsuhiko Chikaoka, Kyoto (JP); Kenji Nagashima, Takatsuki (JP); Takatoshi Nishimura, Osaka (JP); Yasunori Higashiyama, Daito (JP)

(73) Assignee: Funai Electric Co., Ltd., Osaka (JP)

( * ) Notice: Subject to any disclaimer, the term of this patent is extended or adjusted under 35 U.S.C. 154(b) by 29 days.

(21) Appl. No.: 14/822,652

(22) Filed: Aug. 10, 2015

(65) Prior Publication Data

US 2015/0350616 A1    Dec. 3, 2015

Related U.S. Application Data

(62) Division of application No. 13/307,065, filed on Nov. 30, 2011, now Pat. No. 9,104,092.

(30) Foreign Application Priority Data

Nov. 30, 2010   (JP) .................................. 2010-266277

(51) Int. Cl.
    *G03B 21/20*     (2006.01)
    *H04N 9/31*      (2006.01)
    (Continued)

(52) U.S. Cl.
    CPC .......... *H04N 9/3155* (2013.01); *G02B 27/48* (2013.01); *G03B 21/14* (2013.01); *G03B 21/208* (2013.01);
    (Continued)

(58) Field of Classification Search
    CPC ........ G02B 27/48; G02B 26/10; G03B 21/14; G03B 21/20; G03B 21/28; H04N 9/31;
    (Continued)

(56) References Cited

U.S. PATENT DOCUMENTS

| 5,589,955 A | 12/1996 | Amako et al. |
| 2009/0175302 A1* | 7/2009 | Bazzani .............. H01S 5/06209 372/26 |
| 2012/0044279 A1 | 2/2012 | Uchino |

FOREIGN PATENT DOCUMENTS

| JP | 2001-189520 | 7/2001 |
| JP | 2002-207202 | 7/2002 |

(Continued)

OTHER PUBLICATIONS

Extended European Search Report for European Application No. EP 11 19 1147.5, mailed on Apr. 3, 2012, 6 pgs., European Patent Office, Munich, Germany.

*Primary Examiner* — Sultan Chowdhury
*Assistant Examiner* — Danell L Owens
(74) *Attorney, Agent, or Firm* — Baker & Hostetler LLP

(57) ABSTRACT

This display includes a control portion controlling a laser beam generation portion to output a first laser beam including a region of relaxation oscillation to a partial first image forming element included in a plurality of image forming elements and to output a second laser beam including no region of relaxation oscillation to a second image forming element, other than the first image forming element, included in the plurality of image forming elements.

20 Claims, 11 Drawing Sheets

(51) Int. Cl.
  *G02B 27/48* (2006.01)
  *G03B 21/14* (2006.01)
  *G03B 21/28* (2006.01)
  *H01S 5/042* (2006.01)
  *H01S 5/40* (2006.01)

(52) U.S. Cl.
  CPC ............... *G03B 21/28* (2013.01); *H04N 9/31* (2013.01); *H04N 9/3129* (2013.01); *H04N 9/3135* (2013.01); *H04N 9/3161* (2013.01); *H04N 9/3179* (2013.01); *H04N 9/3185* (2013.01); *G03B 21/2033* (2013.01); *G03B 21/2053* (2013.01); *H01S 5/0428* (2013.01); *H01S 5/4093* (2013.01)

(58) Field of Classification Search
  CPC .... H04N 5/74; F01S 5/06; H01S 5/04; G09G 3/20
  See application file for complete search history.

(56) References Cited

FOREIGN PATENT DOCUMENTS

| | | |
|---|---|---|
| JP | 2008-103515 | 5/2008 |
| WO | 2010125866 | 11/2010 |

\* cited by examiner

WAVEFORM OF LASER BEAM INCLUDING REGION OF RELAXATION OSCILLATION

WAVEFORM OF LASER BEAM INCLUDING NO REGION OF RELAXATION OSCILLATION

CHANGING POSITION OF PIXEL CORRESPONDINGLY
TO ARRANGEMENT PATTERN

| FRAME NUMBER | ORDER OF SELECTING ARRANGEMENT PATTERN |
|---|---|
| 0 | PATTERN 1 |
| 1 | PATTERN 2 |
| 2 | PATTERN 3 |
| 3 | PATTERN 1 |
| 4 | PATTERN 2 |
| 5 | PATTERN 3 |
| 6 | PATTERN 1 |
| 7 | PATTERN 2 |
| 8 | PATTERN 3 |
| 9 | PATTERN 1 |
| 10 | PATTERN 2 |

| FIRST FRAME |
|---|
| A PATTERN |
| A PATTERN |
| A PATTERN |
| A PATTERN |

| SECOND FRAME |
|---|
| B PATTERN |
| B PATTERN |
| B PATTERN |
| B PATTERN |

| THIRD FRAME |
|---|
| C PATTERN |
| C PATTERN |
| C PATTERN |
| C PATTERN |

EXAMPLE OF REDUCING STORAGE CAPACITY OF MEMORY

FIG.16

| PICTURE DATA | R | G | B | PICTURE DATA | R | G | B |
|---|---|---|---|---|---|---|---|
| 0 | OFF | OFF | OFF | 128 | OFF | OFF | OFF |
| 1 | OFF | OFF | OFF | 129 | OFF | OFF | OFF |
| 2 | OFF | OFF | OFF | 130 | OFF | OFF | OFF |
| 3 | ON | OFF | ON | 131 | ON | OFF | ON |
| 4 | ON | OFF | ON | 132 | ON | OFF | ON |
| 5 | ON | OFF | ON | 133 | ON | OFF | ON |
| 6 | OFF | ON | ON | 134 | OFF | ON | ON |
| 7 | OFF | ON | ON | 135 | OFF | ON | ON |
| 8 | OFF | ON | ON | 136 | OFF | ON | ON |
| 9 | ON | ON | OFF | 137 | ON | ON | OFF |
| 10 | ON | ON | OFF | 138 | ON | ON | OFF |

ON: OUTPUT INCLUDING REGION OF RELAXATION OSCILLATION
OFF: OUTPUT INCLUDING NO REGION OF RELAXATION OSCILLATION

DISPLAY AND PORTABLE PROJECTOR

CROSS-REFERENCE TO RELATED APPLICATIONS

The present application is a divisional application of U.S. application Ser. No. 13/307,065, with a filing date of Nov. 30, 2011, and this application is also based on and claims priority under 35 U.S.C. §119 From Japanese Patent Application Ser. No. 2010-266277, the entirety of these applications are incorporated herein by reference.

BACKGROUND

1. Field of the Invention

The present invention relates to a display and a portable projector, and more particularly, it relates to a display and a portable projector including a laser beam generation portion generating laser beams.

2. Description of the Background Art

A display including a laser beam generation portion outputting laser beams is known in general, as disclosed in Japanese Patent No. 3475947, for example.

The aforementioned Japanese Patent No. 3475947 discloses a laser marker (display) including a laser beam source (laser beam generation portion) outputting laser beams and a liquid crystal spatial light modulator converting the phases of the laser beams in order to reduce generation of speckle noise (white dotlike irregularities appearing on a portion on which the laser beams are projected) resulting from interference of the laser beams. The laser marker is so formed that the laser beam source continuously outputs the laser beams and the laser marker can reduce generation of speckle noise by passing the output laser beams through the liquid crystal spatial light modulator thereby converting the phases of the laser beams.

However, the laser marker according to the aforementioned Japanese Patent No. 3475947 reduces generation of speckle noise by passing the laser beams output from the laser beam source through the liquid crystal spatial light modulator thereby converting the phases of the laser beams, and hence the structure of the laser marker (display) is disadvantageously complicated due to the requirement for the dedicated liquid crystal spatial light modulator for converting the phases of the laser beams.

SUMMARY

The present invention has been proposed in order to solve the aforementioned problem, and an object of the present invention is to provide a display and a portable projector each capable of reducing generation of speckle noise with a simple structure.

A display according to a first aspect of the present invention includes a laser beam generation portion outputting laser beams, a projection portion projecting an image formed by a plurality of image forming elements on an arbitrary projection region by scanning the projection region with the laser beams, and a control portion controlling the laser beam generation portion to output a first laser beam including a region of relaxation oscillation where the output of the laser beam is unstabilized in an initial lasing stage to a partial first image forming element included in the plurality of image forming elements and to output a second laser beam including no region of relaxation oscillation to a second image forming element, other than the first image forming element, included in the plurality of image forming elements.

In the display according to the first aspect of the present invention, as hereinabove described, the control portion is formed to control the laser beam generation portion to output the first laser beam including the region of relaxation oscillation where the output of the laser beam is unstabilized in the initial lasing stage to the partial first image forming element included in the plurality of image forming elements so that laser beam interference can be suppressed due to the first laser beam including the region of relaxation oscillation and not having a stable wavelength, whereby generation of speckle noise can be efficiently reduced. Further, generation of speckle noise is reduced through the region of relaxation oscillation of the first laser beam so that generation of speckle noise can be easily reduced by simply controlling the laser beam generation portion to output the first laser beam including the region of relaxation oscillation with the control portion dissimilarly to a structure provided with a dedicated liquid crystal spatial light modulator for converting the phases of the laser beams, whereby the display can be inhibited from complication in structure. Consequently, this display can reduce generation of speckle noise with a simple structure. The control portion controls the laser beam generation portion to output the first laser beam including the region of relaxation oscillation where the output of the laser beam is unstabilized in the initial lasing stage to the partial first image forming element included in the plurality of image forming elements and to output the second laser beam including no region of relaxation oscillation to the second image forming element, other than the first image forming element, included in the plurality of image forming elements so that the laser beam generation portion outputs the second laser beam whose output is stable in addition to the first laser beam whose output is unstable, whereby brightness of the image projected on the projection region can be inhibited from reduction as compared with a case where the laser beam generation portion outputs only the first laser beam whose output is unstable.

In the aforementioned display according to the first aspect, the control portion is preferably formed to change the positions of the first image forming element and the second image forming element in the image formed by the plurality of image forming elements every prescribed frame number of the image formed by the plurality of image forming elements. According to this structure, regions where generation of speckle noise is suppressed are dispersed (leveled) over the entire image due to switching of frames, whereby generation of speckle noise can be effectively reduced in the overall image.

In this case, the control portion is preferably formed to change the positions of the first image forming element and the second image forming element every prescribed frame number of the image by randomly selecting the positions of the first image forming element and the second image forming element in the image formed by the plurality of image forming elements every prescribed frame number of the image formed by the plurality of image forming elements. According to this structure, the control portion can easily prevent the first image forming element and the second image forming element from being fixed on the same positions by randomly selecting and changing the positions of the first image forming element and the second image forming element. Further, the control portion so randomly selects and changes the positions of the first image forming element and the second image forming element every prescribed frame number that no storage region may be provided for storing arrangement patterns of the positions of the first image forming element and the second image forming element.

In the aforementioned display having the control portion randomly selecting and changing the positions of the first image forming element and the second image forming element every prescribed frame number, the control portion is preferably formed to repeat a series of cycles performing processing of randomly selecting and changing the positions of the first image forming element and the second image forming element in the image every prescribed frame number over a period consisting of frames of n times the prescribed frame number when the ratio of the first image forming element per frame of the image formed by the first image forming element and the second image forming element whose positions have been randomly selected is 1/n. According to this structure, it is counted that the first image forming element is assigned once (1/n×n=1) substantially to every image forming element in the period (consisting of frames of n times the prescribed frame number) when the control portion performs the series of cycles once, whereby the control portion can reduce generation of speckle noise in a well-balanced manner on positions of all image forming elements by repeating the series of cycles.

In the aforementioned display having the control portion changing the positions of the first image forming element and the second image forming element every prescribed frame number, the control portion is preferably formed to change the positions of the first image forming element and the second image forming element in the image formed by the plurality of image forming elements every prescribed frame number of the image formed by the plurality of image forming elements on the basis of a previously set prescribed arrangement pattern. According to this structure, the control portion can uniformly suppress generation of speckle noise over the entire image by previously setting the prescribed arrangement pattern to uniformly move the positions of the first image forming element and the second image forming element over the entire image, for example, whereby the control portion can more effectively reduce generation of speckle noise in the overall image.

In this case, the arrangement pattern is preferably so formed that the control portion changes the positions of the first image forming element and the second image forming element so that the laser beam generation portion outputs the first laser beam to each of the plurality of image forming elements at least once during a frame period consisting of frames of a plurality of times the prescribed frame number. According to this structure, the laser beam generation portion outputs the first laser beam reducing generation of speckle noise at least once to each of the plurality of image forming elements during the frame period consisting of the frames of the plurality of times the prescribed frame number, whereby the control portion can reduce generation of speckle noise on the positions of all image forming elements while suppressing reduction in brightness.

In the aforementioned display having the control portion controlling the laser beam generation portion to output the first laser beam to each of the plurality of image forming elements at least once during the frame period, the frame period is preferably a frame period consisting of frames of at least n times the prescribed frame number when the ratio of the first image forming element per frame in the arrangement pattern of the first image forming element and the second image forming element is 1/n. According to this structure, it is counted that the first image forming element is assigned at least once (1/n×n=1) to every image forming element in the frame period consisting of the frames of n times the prescribed frame number, whereby the control portion can reduce generation of speckle noise on positions of all image forming elements.

In this case, the frame period is preferably a frame period consisting of frames of n times the prescribed frame number. According to this structure, it is counted that the first image forming element is assigned once (1/n×n=1) to every image forming element in the frame period consisting of the frames of n times the prescribed frame number, whereby the control portion can reduce generation of speckle noise on positions of all image forming elements in a shorter period.

In the aforementioned display having the control portion changing the positions of the first image forming element and the second image forming element on the basis of the prescribed arrangement pattern, the control portion is preferably formed to change the positions of the first image forming element and the second image forming element in the image formed by the plurality of image forming elements every prescribed frame on the basis of the prescribed arrangement pattern consisting of arrangement positions of the first image forming element and the second image forming element in a region of a size corresponding to one image formed by the plurality of image forming elements. According to this structure, the control portion can easily change the positions of the first image forming element and the second image forming element in the whole of one image on the basis of the prescribed arrangement pattern consisting of the arrangement positions of the first image forming element and the second image forming element in the region of the size corresponding to one image.

In the aforementioned display having the control portion changing the positions of the first image forming element and the second image forming element on the basis of the prescribed arrangement pattern, the control portion is preferably formed to change the positions of the first image forming element and the second image forming element in the image formed by the plurality of image forming elements every prescribed frame on the basis of an arrangement pattern formed by connecting a plurality of prescribed arrangement patterns consisting of arrangement positions of the first image forming element and the second image forming element in a region obtained by dividing the region of the size corresponding to one image formed by the plurality of image forming elements. According to this structure, the control portion can change the positions of the first image forming element and the second image forming element in the whole of one image on the basis of the arrangement pattern having a data quantity smaller than that of the prescribed arrangement pattern consisting of the arrangement positions of the first image forming element and the second image forming element in the region of the size corresponding to one image.

In the aforementioned display having the control portion changing the positions of the first image forming element and the second image forming element on the basis of the prescribed arrangement pattern, the arrangement pattern of the first image forming element and the second image forming element is preferably so formed that the ratio of arrangement of the first image forming element is higher on both end portions of the image consisting of the image forming elements in a scanning direction than on a central portion in the scanning direction. The scanning rate is smaller on both end portions in the scanning direction than on the central portion in the scanning direction, and hence the quantities of the laser beams output to both end portions in the scanning direction are larger as compared with those of the laser beams output to the central portion in the scanning direction. When the display is so formed that the ratio of arrangement of the first image forming element is higher on both end portions in the scanning direction in this case, sufficient brightness can be ensured while sufficiently suppressing generation of speckle noise on both end portions in the scanning direction.

The aforementioned display having the control portion changing the positions of the first image forming element and the second image forming element on the basis of the prescribed arrangement pattern preferably further includes a storage portion storing the arrangement pattern of the first image forming element and the second image forming element. According to this structure, the control portion can easily arrange the positions of the first image forming element and the second image forming element according to the previously set prescribed arrangement pattern on the basis of the arrangement pattern of the first image forming element and the second image forming element stored in the storage portion.

In the aforementioned display having the control portion changing the positions of the first image forming element and the second image forming element every prescribed frame, the prescribed frame number of the image formed by the plurality of image forming elements is preferably one. According to this structure, the control portion can change the positions of the first image forming element and the second image forming element in the image consisting of the plurality of image forming elements every frame so that the same can more disperse (level) the regions where generation of speckle noise is suppressed over the entire image as compared with a case of changing the positions of the first image forming element and the second image forming element every plurality of frames, whereby the control portion can effectively reduce generation of speckle noise in the overall image.

In the aforementioned display according to the first aspect, the laser beam generation portion preferably includes a red laser beam generation portion outputting a red laser beam, a green laser beam generation portion outputting a green laser beam and a blue laser beam generation portion outputting a blue laser beam, and the control portion is preferably formed to increase the ratio of the first image forming element corresponding to the first laser beam including the region of relaxation oscillation in order of the blue laser beam generation portion, the red laser beam generation portion and the green laser beam generation portion. According to this structure, the ratio of the first image forming element can be increased in the green laser beam generation portion easily generating speckle noise while reducing the ratio of the first image forming element in the blue laser beam generation portion hardly generating speckle noise, whereby generation of speckle noise can be effectively reduced in response to the colors of the laser beams.

The aforementioned display according to the first aspect is preferably so formed that the user can set the ratio of the partial first image forming element in the plurality of image forming elements and the ratio of the second image forming element, other than the first image forming element, included in the plurality of image forming elements. According to this structure, the user himself/herself can set the display to increase the ratio of the first image forming element when he/she wishes to more reduce generation of speckle noise or to increase the ratio of the second image forming element when he/she wishes to more ensure brightness of the image, whereby the display can flexibly respond to the user for displaying an image (picture) desirable for him/her.

A portable projector according to a second aspect of the present invention includes a laser beam generation portion outputting laser beams, a projection portion projecting an image formed by a plurality of image forming elements on an arbitrary projection region by scanning the projection region with the laser beams, and a control portion controlling the laser beam generation portion to output a first laser beam including a region of relaxation oscillation where the output of the laser beam is unstabilized in an initial lasing stage to a partial first image forming element included in the plurality of image forming elements and to output a second laser beam including no region of relaxation oscillation to a second image forming element, other than the first image forming element, included in the plurality of image forming elements, and is so formed that the user can use the portable projector in a state carrying the portable projector.

In the portable projector according to the second aspect of the present invention, as hereinabove described, the control portion is formed to control the laser beam generation portion to output the first laser beam including the region of relaxation oscillation where the output of the laser beam is unstabilized in the initial lasing stage to the partial first image forming element included in the plurality of image forming elements so that laser beam interference can be suppressed due to the first laser beam including the region of relaxation oscillation and not having a stable wavelength, whereby generation of speckle noise can be efficiently reduced. Further, generation of speckle noise is reduced through the region of relaxation oscillation of the first laser beam so that generation of speckle noise can be easily reduced by simply controlling the laser beam generation portion to output the first laser beam including the region of relaxation oscillation with the control portion dissimilarly to a structure provided with a dedicated liquid crystal spatial light modulator for converting the phases of the laser beams, whereby the portable projector can be inhibited from complication in structure. Consequently, this portable projector can reduce generation of speckle noise with a simple structure. The control portion controls the laser beam generation portion to output the first laser beam including the region of relaxation oscillation where the output of the laser beam is unstabilized in the initial lasing stage to the partial first image forming element included in the plurality of image forming elements and to output the second laser beam including no region of relaxation oscillation to the second image forming element, other than the first image forming element, included in the plurality of image forming elements so that the laser beam generation portion outputs the second laser beam whose output is stable in addition to the first laser beam whose output is unstable, whereby brightness of the image projected on the projection region can be inhibited from reduction as compared with a case where the laser beam generation portion outputs only the first laser beam whose output is unstable.

In the aforementioned portable projector according to the second aspect, the control portion is preferably formed to change the positions of the first image forming element and the second image forming element in the image formed by the plurality of image forming elements every prescribed frame number of the image formed by the plurality of image forming elements. According to this structure, regions where generation of speckle noise is suppressed are dispersed (leveled) over the entire image due to switching of frames, whereby generation of speckle noise can be effectively reduced in the overall image.

In this case, the control portion is preferably formed to change the positions of the first image forming element and the second image forming element every prescribed frame number of the image by randomly selecting the positions of the first image forming element and the second image forming element in the image formed by the plurality of image forming elements every prescribed frame number of the image formed by the plurality of image forming elements. According to this structure, the control portion can easily prevent the first image forming element and the second image forming element from being fixed on the same positions by randomly selecting and changing the positions of the first image forming element and the second image forming element. Further, the control portion so randomly selects and changes the positions of the first image forming element and the second image forming element every prescribed frame number that no storage region may be provided for storing arrangement patterns of the positions of the first image forming element and the second image forming element.

In the aforementioned portable projector having the control portion randomly selecting and changing the positions of the first image forming element and the second image forming element every prescribed frame number, the control portion is preferably formed to repeat a series of cycles performing processing of randomly selecting and changing the positions of the first image forming element and the second image forming element in the image every prescribed frame number over a period consisting of frames of n times the prescribed frame number when the ratio of the first image forming element per frame of the image formed by the first image forming element and the second image forming element whose positions have been randomly selected is 1/n. According to this structure, it is counted that the first image forming element is assigned once (1/n×n=1) substantially to every image forming element in the period (consisting of the frames of n times the prescribed frame number) when the control portion performs the series of cycles once), whereby the control portion can reduce generation of speckle noise in a well-balanced manner on positions of all image forming elements by repeating the series of cycles.

In the aforementioned portable projector having the control portion changing the positions of the first image forming element and the second image forming element every prescribed frame, the control portion is preferably formed to change the positions of the first image forming element and the second image forming element in the image formed by the plurality of image forming elements every prescribed frame number of the image formed by the plurality of image forming elements on the basis of a previously set prescribed arrangement pattern. According to this structure, the control portion can uniformly suppress generation of speckle noise over the entire image by previously setting the prescribed arrangement pattern to uniformly move the positions of the first image forming element and the second image forming element over the entire image, for example, whereby the control portion can more effectively reduce generation of speckle noise in the overall image.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 16 is a diagram for illustrating an example of varying the outputs of laser beams including regions of relaxation oscillation with a red LD, a blue LD and a green LD in the portable projector according to the fifth embodiment of the present invention.

DETAILED DESCRIPTION

Embodiments of the present invention are now described with reference to the drawings.

First Embodiment

The structure of a portable projector 100 according to a first embodiment of the present invention is now described with reference to FIGS. 1 to 6. The portable projector 100 is an example of the "display" in the present invention.

Figure 1:
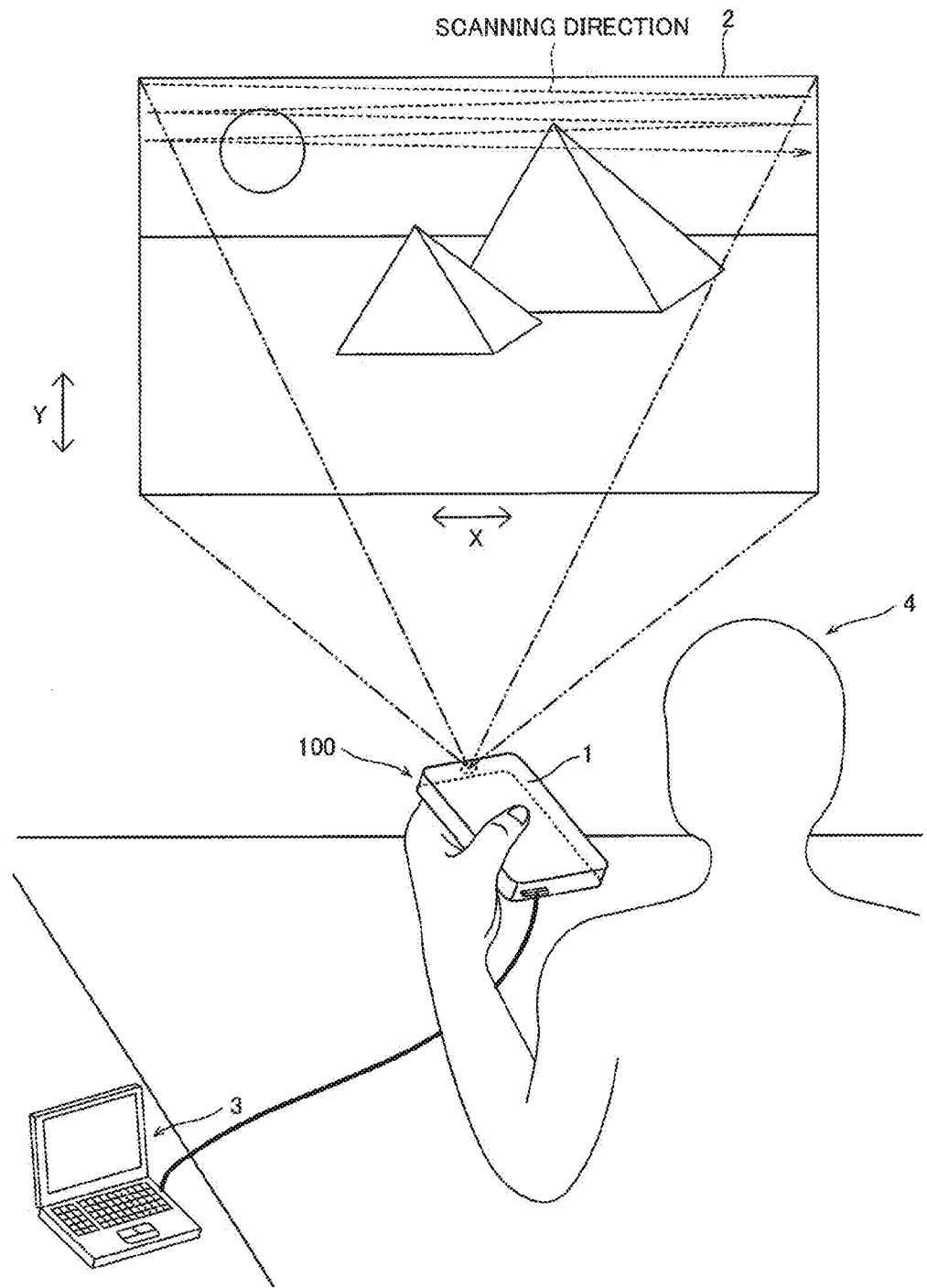
FIG. 1 illustrates an in-use state of a portable projector according to a first embodiment of the present invention.

The portable projector 100 according to the first embodiment of the present invention is formed to project laser beams (RGB laser beams) of three colors, i.e., red, green and blue, onto a projection region 2 consisting of an X-Y plane, as shown in FIG. 1. Further, the portable projector 100 is formed to be capable of projecting a picture (image) consisting of a plurality of pixels (image forming elements) onto the projection region 2 by scanning the projection region 2 with the RGB laser beams. In addition, the portable projector 100 is formed to be connected with a personal computer 3 through a picture input interface 10 (see FIG. 2), thereby projecting a picture received from the personal computer 3 onto the projection region (screen 2). Further, the portable projector 100 is so formed that a user 4 can use the same in a state carrying the portable projector 100.

Figure 2:
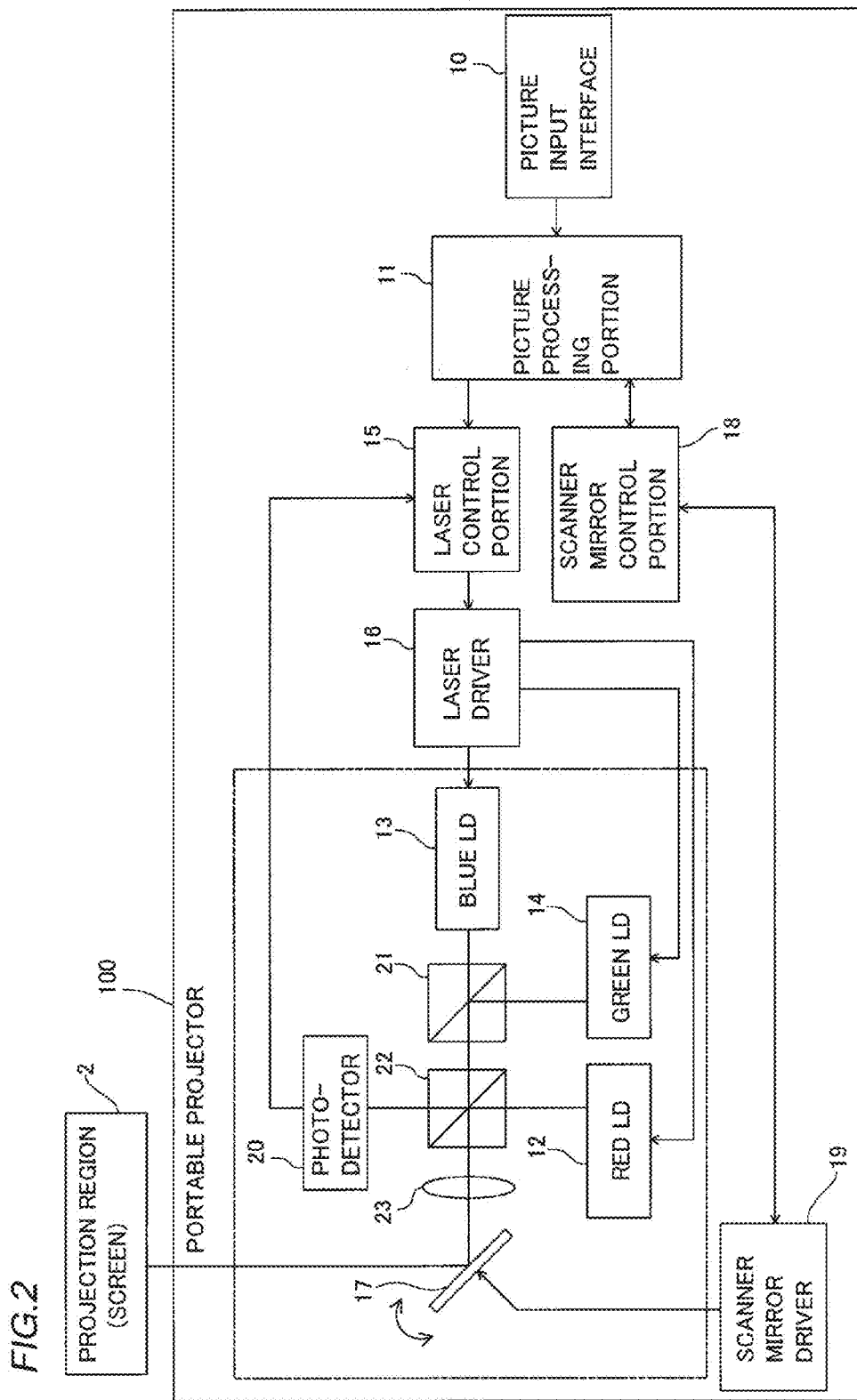
FIG. 2 is a block diagram showing the structure of the portable projector according to the first embodiment of the present invention.

The structure of the portable projector 100 is now described. As shown in FIG. 2, the portable projector 100 includes a red laser diode (red LD) 12 capable of outputting the red laser beam, a blue laser diode (blue LD) 13 capable of outputting the blue laser beam, a green laser diode (green LD) 14 capable of outputting the green laser beam, a laser control portion 15 and a laser driver 16. The red LD 12, the blue LD 13 and the green LD 14 are examples of the "laser beam generation portion" in the present invention, and examples of the "red laser beam generation portion", the "blue laser beam generation portion" and the "green laser beam generation portion" in the present invention respectively. The laser control portion 15 and the laser driver 16 are examples of the "control portion" in the present invention. The portable projector 100 further includes a single scanner mirror 17, a scanner mirror control portion 18, a scanner mirror driver 19 driving the scanner mirror 17 and a photodetector 20 detecting the gradations of the RGB laser beams. As an optical system of the portable projector 100, two half mirrors 21 and 22 and a lens 23 are provided in addition to the red LD 12, the blue LD 13, the green LD 14, the scanner mirror 17 and the photodetector 20. These elements of the portable projector 100 are stored in a projector body (housing) 1 (see FIG. 1).

The picture processing portion 11 is formed to transmit video signal data to the laser control portion 15 at a prescribed time interval on the basis of a picture signal received from the personal computer 3 (see FIG. 1). Thus, the laser control portion 15 is enabled to recognize pixel (image forming element) information on a prescribed scanning position.

According to the first embodiment, the laser control portion 15 is formed to control the laser driver 16, in order to project the picture consisting of the plurality of pixels onto the projection region 2 on the basis of the pixel information recognized by the picture processing portion 11. Further, the laser control portion 15 is formed to perform processing for reducing speckle noise generated in the picture projected on the projection region 2 due to interference of laser beams having stable wavelengths. In addition, the laser control portion 15 is formed to randomly select and change positions to which laser beams (see FIG. 4) including regions of relaxation oscillation (including regions driven to reduce speckle noise) described later are output and positions to which laser beams (see FIG. 5) including no regions of relaxation oscillation (including only ordinary driven regions) are output every frame of the picture consisting of prescribed pixels to which the laser beams including the regions of relaxation oscillation and the laser beams including no regions of relaxation oscillation are output respectively.

Figure 3:
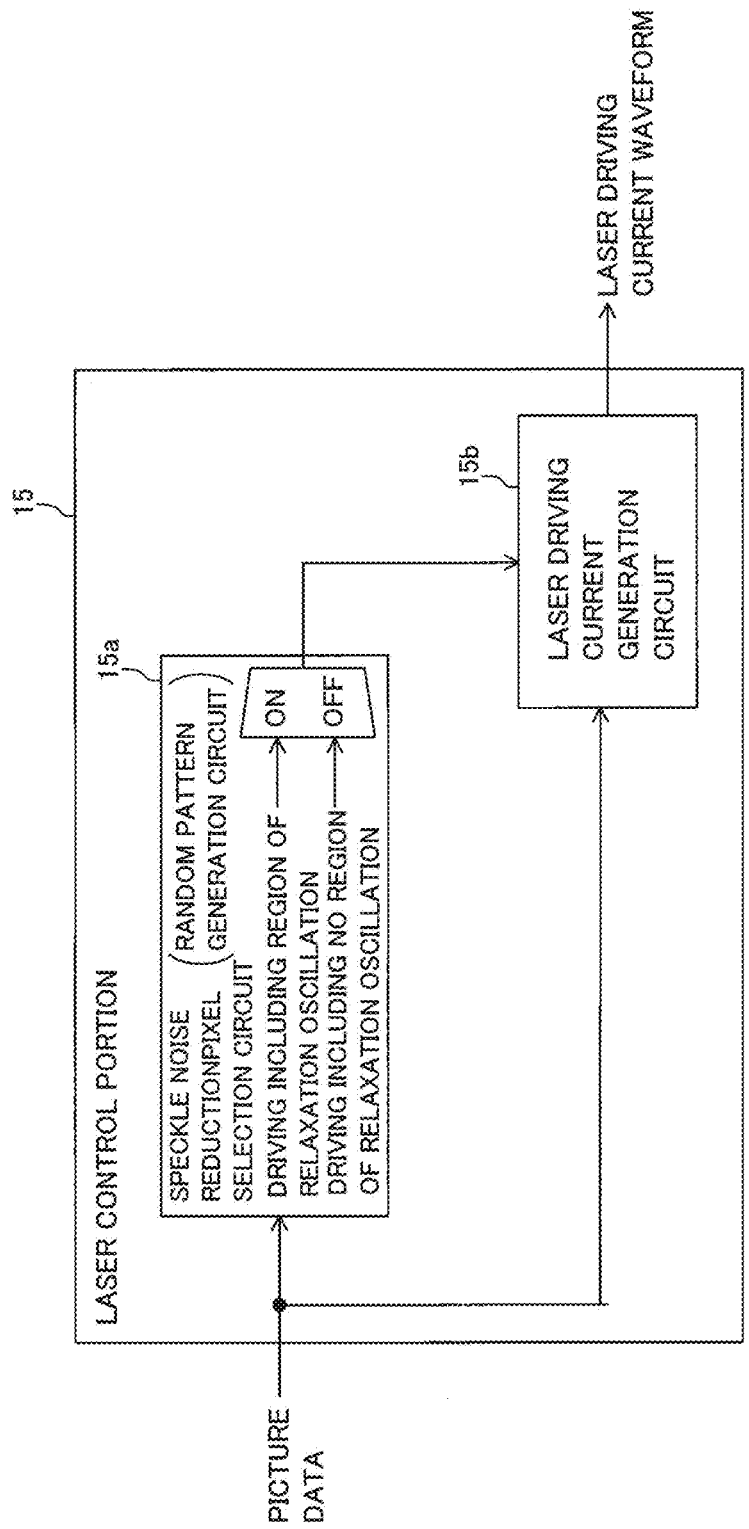
FIG. 3 is a block diagram showing the structure of a laser control portion of the portable projector according to the first embodiment of the present invention.

More specifically, the laser control portion 15 includes a speckle noise reduction pixel selection circuit 15a as a random pattern generation circuit and a laser driving current generation circuit 15b, as shown in FIG. 3. The speckle noise reduction pixel selection circuit 15a has a function of selectively outputting either the laser beams (see FIG. 4) including the regions of relaxation oscillation or the laser beams (see FIG. 5) including no regions of relaxation oscillation to prescribed pixels in the picture. Further, the speckle noise reduction pixel selection circuit 15a is formed to randomly select about 33% (⅓) of all pixels included in one frame and to output the laser beams including the regions of relaxation oscillation to the selected pixels, as shown in FIG. 6. The speckle noise reduction pixel selection circuit 15a performs this processing over a period (three frames) consisting of frames three times one frame, and thereafter repeats the series of cycles.

In other words, the laser control portion 15 is formed to generate a random pattern for selecting about 33% (⅓) of pixels as those subjected to reduction of speckle noise every frame, and to select the pixels subjected to reduction of speckle noise on the basis of the generated random pattern and to output the laser beams including the regions of relaxation oscillation to the selected pixels in the first embodiment. Thus, the pixels subjected to reduction of speckle noise are changed every frame. In this case, it becomes possible to disperse (level) regions where generation of speckle noise is suppressed in a long frame period consisting of a plurality of frames. The generated random pattern is not relevant every frame, but the positions of pixels to which the laser beams including the regions of relaxation oscillation are output may overlap between frames. The laser beams including the regions of relaxation oscillation are examples of the "first laser beam" in the present invention, and the laser beams including no regions of relaxation oscillation are examples of the "second laser beam" in the present invention. The pixels to which the laser beams including the regions of relaxation oscillation are output are examples of the "first image forming element" in the present invention, and the pixels to which the laser beams including no regions of relaxation oscillation are output are examples of the "second image forming element" in the present invention. Further, one frame is an example of the "prescribed frame number" in the present invention.

The speckle noise reduction pixel selection circuit 15a is so formed in the aforementioned manner that the laser driving current generation circuit 15b can receive a signal output from the speckle noise reduction pixel selection circuit 15a and output laser driving current waveforms of the laser beams including the regions of relaxation oscillation or the laser beams including no regions of relaxation oscillation to the laser driver 16 in response to the received signal. The laser driver 16 is formed to drive the red LD 12, the blue LD 13 and the green LD 14 on the basis of the aforementioned control operation of the laser control portion 15. More specifically, the laser driver 16 is formed to repeat operations of supplying current higher than lasing threshold current $I_{th}$ (see FIG. 4) to the red LD 12, the blue LD 13 and the green LD 14 and reducing the current to a level less than the threshold current $I_{th}$ when outputting the laser beams including the regions of relaxation oscillation. Further, the laser driver 16 is formed to stop outputting the laser beams by reducing the current to a level less than the threshold current $I_{th}$ once every pixel when outputting the laser beams including the regions of relaxation oscillation. In addition, the laser driver 16 is formed to continuously supply the current higher than the lasing threshold current $I_{th}$ (see FIG. 5) to the red LD 12, the blue LD 13 and the green LD 14 when outputting the laser beams including no regions of relaxation oscillation.

Figure 4:
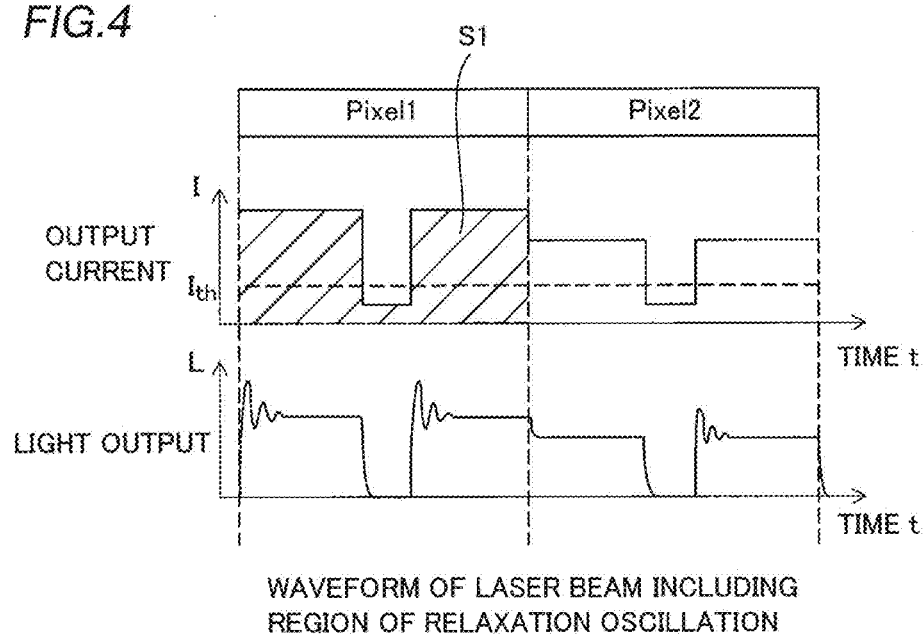
FIG. 4 is a timing chart showing the relation between current and optical output of a laser diode outputting a laser beam including a region of relaxation oscillation in the portable projector according to the first embodiment of the present invention.
Figure 5:
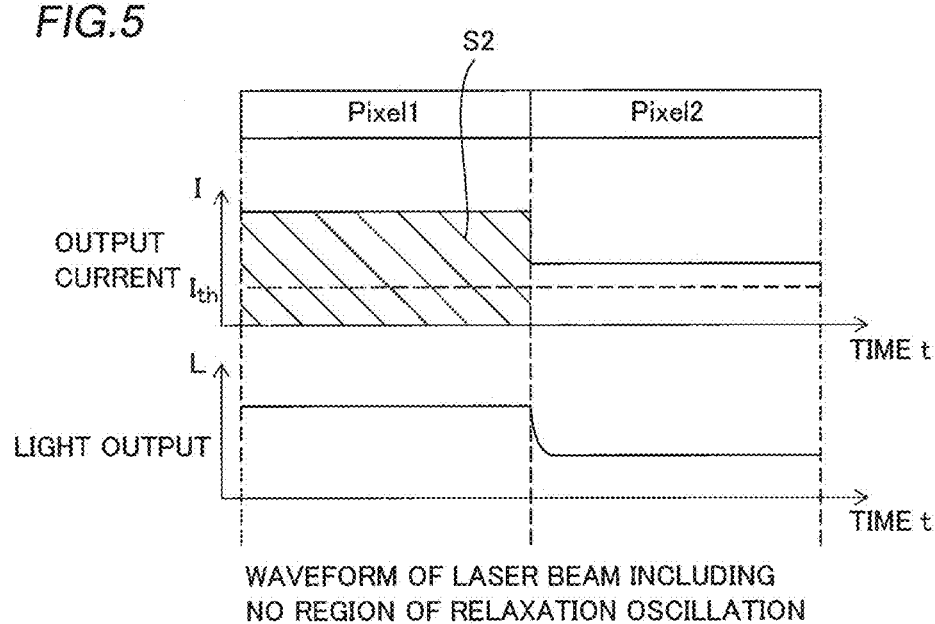
FIG. 5 is a timing chart showing the relation between current and optical output of the laser diode outputting a laser beam including no region of relaxation oscillation in the portable projector according to the first embodiment of the present invention.
Figure 6:
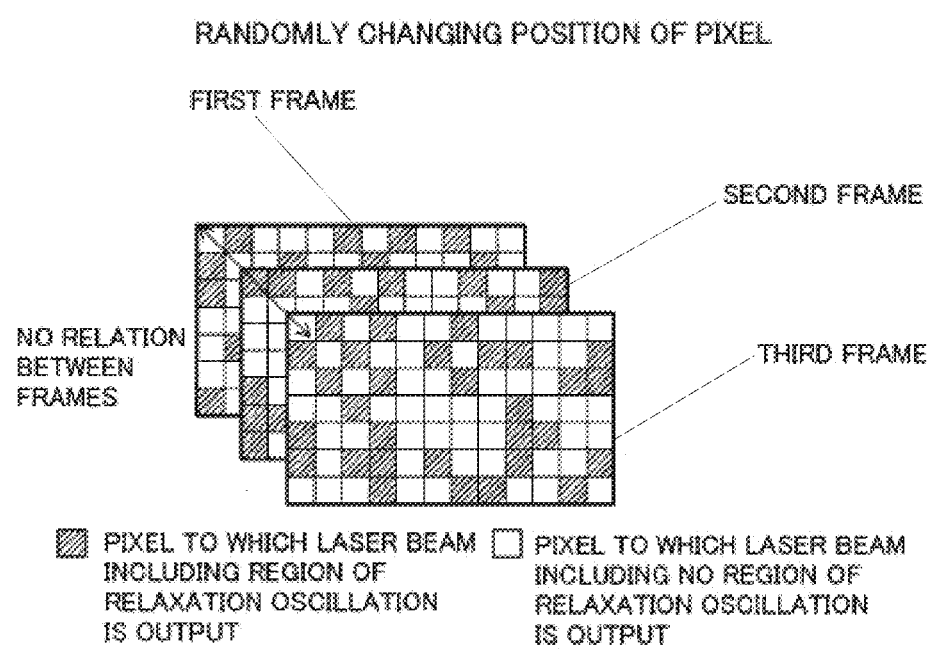
FIG. 6 is a schematic diagram showing an example of randomly changing positions of pixels to which laser beams are output in the portable projector according to the first embodiment of the present invention.

The red LD 12, the blue LD 13 and the green LD 14 have properties of a general laser diode respectively, as shown in FIGS. 4 and 5. In other words, the red LD 12, the blue LD 13 and the green LD 14 emit laser beams by induced emission respectively when the supplied current is at least a constant value (lasing threshold current $I_{th}$). Thus, the red LD 12, the blue LD 13 and the green LD 14 are enabled to output laser beams when supplied with current of at least the lasing threshold current $I_{th}$. On the other hand, the red LD 12, the blue LD 13 and the green LD 14 are enabled to stop outputting laser beams when supplied with current less than the lasing threshold current $I_{th}$. The red LD 12, the blue LD 13 and the green LD 14 are formed to output laser beams larger in brightness as the current supplied thereto is increased.

According to the first embodiment, each of the laser beams output from the red LD 12, the blue LD 13 and the green LD 14 exhibits such an oscillational phenomenon that the output shape thereof is waved in an initial lasing stage, as shown in FIG. 4. This waved shape is gradually attenuated with the lapse of the time for outputting the laser beam, and this oscillational phenomenon in which the laser beam is unstabilized in the initial lasing stage is referred to as relaxation oscillation. This relaxation oscillation converges on a constant output after a lapse of a prescribed period (about 3 nsec). In a region of relaxation oscillation, interference with another laser beam can be relaxed due to the waved shape of the laser output, whereby generation of speckle noise (white dotlike irregularities appearing on a portion on which the laser beam is projected) can be suppressed. Therefore, the portable projector 100 according to the first embodiment is formed to reduce generation of speckle noise by outputting the laser beams including the regions of relaxation oscillation. According to the first embodiment, a period when the outputs of the laser beams are stabilized after relaxation oscillation is set to be longer than the prescribed period of relaxation oscillation.

The single scanner mirror 17 is a small-sized vibrating mirror element, driven by the scanner mirror driver 19 on X- and Y-axes, vibrative at a prescribed vibration angle. Thus, the scanner mirror 17 can scan the projection region 2 in directions X and Y. The scanner mirror control portion 18 is formed to control the scanner mirror driver 19 on the basis of pixel information on a certain prescribed scanning position recognized by the picture processing portion 11. In other words, the scanner mirror 17 is formed to so vibrate as to scan the projection region 2 with the RGB laser beams over the projection region 2 in a zigzag manner (in the direction X (see FIG. 1) while deviating the vertical position in the direction Y) on the basis of a control operation of the scanner mirror control portion 18. The scanner mirror 17 is an example of the "projection portion" in the present invention.

The photodetector 20 is arranged to be capable of detecting the laser beams output from the red LD 12, the blue LD 13 and the green LD 14. Further, the photodetector 20 is connected with the laser control portion 15, and formed to output the gradations of the detected laser beams to the laser control portion 15. In addition, the laser control portion 15 is formed to determine whether or not the gradations received from the photodetector 20 are correct as compared with the pixel information on the scanning position and to adjust the outputs (brightness) of the red LD 12, the blue LD 13 and the green LD 14 if the gradations are not correct.

The structure of the optical system of the portable projector 100 is now described. As shown in FIG. 2, the half mirror 21 is arranged on a position where the blue and green laser beams perpendicularly intersect with each other. The half mirror 21 is formed to transmit the blue laser beam therethrough and to reflect the green laser beam. On the other hand, the half mirror 22 is arranged on a position where the blue laser beam transmitted through the half mirror 21, the green laser beam and the red laser beam perpendicularly intersect with each other. The half mirror 22 is formed to partially reflect the blue and laser beams toward the photodetector 20 and to transmit the remaining blue and green laser beams toward the lens 23. Further, the half mirror 22 is formed to partially transmit the red laser beam toward the photodetector 20 and to reflect the remaining red laser beam toward the lens 23. The lens 23 has a function of forming the RGB laser beams having prescribed gradations by aligning the optical axes of the red, blue and green laser beams with each other. The RGB laser beams whose optical axes have been aligned with each other through the lens 23 are reflected by the scanner mirror 17, to scan the projection region 2.

According to the first embodiment, as hereinabove described, the portable projector 100 outputs the laser beams including the regions of relaxation oscillation where the outputs of the laser beams are unstabilized in initial lasing stages to partial pixels included in the plurality of image forming elements (pixels) to be capable of suppressing interference of the laser beams due to the laser beams including the regions of relaxation oscillation and having unstable waveforms, whereby generation of speckle noise can be effectively reduced. Further, the portable projector 100 reduces generation of speckle noise with the regions of relaxation oscillation of the laser beams including the regions of relaxation oscillation so that the same can easily reduce generation of speckle noise by simply outputting the laser beams including the regions of relaxation oscillation with the laser control portion 15 and the laser driver 16 dissimilarly to a structure provided with a dedicated liquid crystal spatial light modulator or the like for converting the phases of the laser beams, whereby the portable projector 100 can be inhibited from complication in structure. Consequently, the portable projector 100 can reduce generation of speckle noise with a simple structure. Further, the portable projector 100 outputs the laser beams including the regions of relaxation oscillation where the outputs of the laser beams are unstabilized in the initial lasing stages to partial pixels included in the plurality of image forming elements (pixels) while outputting the laser beams including no regions of relaxation oscillation to the remaining pixels included in the plurality of image forming elements (pixels) to output the laser beams including no regions of relaxation oscillation whose outputs are stable in addition to the laser beams including the regions of relaxation oscillation whose outputs are unstable, whereby the portable projector 100 can suppress reduction of brightness of the image projected on the projection region 2 as compared with a case of outputting only the laser beams including the regions of relaxation oscillation whose outputs are unstable.

According to the first embodiment, as hereinabove described, the laser control portion 15 and the laser driver 16 are formed to change the positions of the pixels to which the laser beams including the regions of relaxation oscillation and the laser beams including no regions of relaxation oscillation are output respectively every frame of the image consisting of the plurality of pixels. Thus, regions where generation of speckle noise is suppressed are dispersed (leveled) over the entire image due to switching of frames, whereby generation of speckle noise can be effectively reduced in the overall image.

According to the first embodiment, as hereinabove described, the laser control portion 15 and the laser driver 16 are formed to change the positions of the pixels to which the laser beams including the regions of relaxation oscillation and the laser beams including no regions of relaxation oscillation are output respectively every frame of the image consisting of the plurality of pixels by randomly selecting the positions of the pixels to which the laser beams including the regions of relaxation oscillation and the laser beams including no regions of relaxation oscillation are output respectively every frame of the image. Thus, the laser control portion 15 and the laser driver 16 can easily prevent the pixels to which the laser beams including the regions of relaxation oscillation and the laser beams including no regions of relaxation oscillation are output respectively from being fixed on the same positions. Further, the laser control portion 15 and the laser driver 16 randomly select and change the positions of the pixels to which the laser beams including the regions of relaxation oscillation and the laser beams including no regions of relaxation oscillation are output respectively every frame of the image, whereby the portable projector 100 may not be provided with a memory or the like for storing an arrangement pattern of the positions of the pixels to which the laser beams including the regions of relaxation oscillation and the laser beams including no regions of relaxation oscillation are output respectively.

According to the first embodiment, as hereinabove described, the ratio of the pixels to which the laser beams including the regions of relaxation oscillation and the laser beams including no regions of relaxation oscillation are output respectively per frame of the image consisting of the plurality of pixels is set to about 33% ($\frac{1}{3}$), and the laser control portion 15 and the laser driver 16 are formed to repeat the series of cycles (see FIG. 6) of the processing of randomly selecting and changing the positions of the pixels to which the laser beams including the regions of relaxation oscillation and the laser beams including no regions of relaxation oscillation are output respectively every frame over the period (three frames) consisting of the frames three times one frame. Thus, it is counted that the laser beams including the regions of relaxation oscillation are output once ($\frac{1}{3} \times 3 = 1$) substantially to every pixel in the period (consisting of the frames of n times the prescribed frame number) when the laser control portion 15 and the laser driver 16 perform the series of cycles once, whereby the laser control portion 15 and the laser driver 16 can reduce generation of speckle noise in a well-balanced manner on positions of all pixels by repeating the series of cycles. As shown in FIG. 6, in the first frame, the ratio of the pixels of the laser beams including the regions of relaxation oscillation with respect to the laser beams including no regions of relaxation oscillation, is about 33%. Similarly, in the second frame, the ratio of the pixels of the laser beams including the regions of relaxation oscillation with respect to the laser beams including no regions of relaxation oscillation, is about 33%. In the third frame, the ratio of the pixels of the laser beams including the regions of relaxation oscillation with respect to the laser beams including no regions of relaxation oscillation, is about 33%. There exists no relation between the frames.

Second Embodiment

A portable projector according to a second embodiment of the present invention is now described with reference to FIGS. 7 to 9. According to the second embodiment, the portable projector changes positions of pixels to which laser beams including regions of relaxation oscillation and laser beams including no regions of relaxation oscillation are output respectively on the basis of previously set arrangement patterns of pixels, dissimilarly to the portable projector 100 according to the aforementioned first embodiment randomly selecting and changing the positions of the pixels to which the laser beams including the regions of relaxation oscillation and the laser beams including no regions of relaxation oscillation are output respectively every frame.

Figure 7:
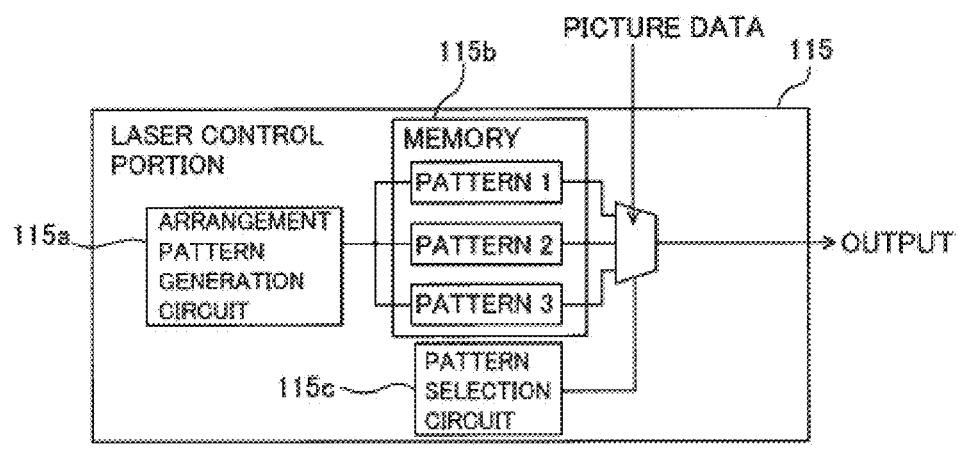
FIG. 7 is a block diagram showing the structure of a laser control portion of a portable projector according to a second embodiment of the present invention.

In the portable projector according to the second embodiment, a laser control portion 115 includes an arrangement pattern generation circuit 115a, a memory 115b storing arrangement patterns (patterns 1, 2 and 3) generated by the arrangement pattern generation circuit 115a and a pattern selection circuit 115c selecting the arrangement patterns from the memory 115b, as shown in FIG. 7. The laser control portion 115 is formed to change the positions of pixels to which laser beams including previously set regions of relaxation oscillation (including regions driven to reduce speckle noise) and laser beams including no regions of relaxation oscillation (including only ordinary driven regions) are output respectively every frame of a picture on the basis of the arrangement patterns of the pixels to which the laser beams including the previously set regions of relaxation oscillation and the laser beams including no regions of relaxation oscillation are output respectively. The laser control portion 115 is an example of the "control portion" in the present invention. The memory 115b is an example of the "storage portion" in the present invention.

The arrangement pattern generation circuit 115a has a function of generating the arrangement patterns (see FIG. 8) of the pixels to which the laser beams including the regions of relaxation oscillation and the laser beams including no regions of relaxation oscillation are output respectively. According to the second embodiment, each arrangement pattern corresponds to a region having a size corresponding to a single image consisting of a plurality of pixels, as shown in FIG. 8. In other words, each arrangement pattern consists of arrangement positions of the pixels to which the laser beams including the regions of relaxation oscillation and the laser beams including no regions of relaxation oscillation are output respectively in the region having the size corresponding to the single image consisting of the plurality of pixels. As shown in FIG. 8, in the first frame, the pixel output including region of relaxation oscillation is about 33%. In the second frame, the pixel output including region of relaxation oscillation is about 33%. In the third frame, the pixel output including region of relaxation oscillation is about 33%. The laser beam including region of relaxation oscillation is output to each pixel at least once throughout the three frames.

Figure 8:
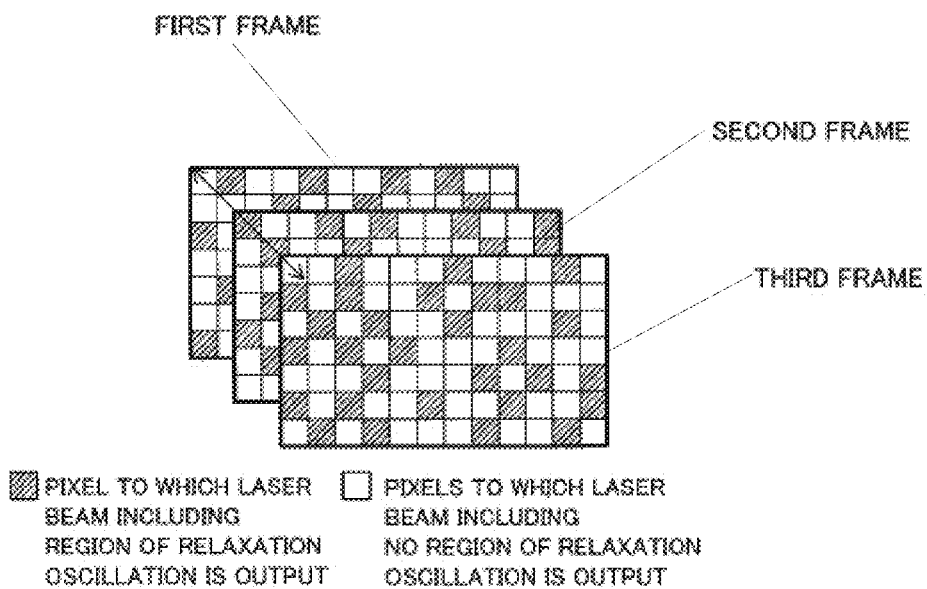
FIG. 8 is a schematic diagram for illustrating an example of changing positions of pixels to which laser beams are output correspondingly to an arrangement pattern in the portable projector according to the second embodiment of the present invention.

Further, the arrangement pattern generation circuit 115a is formed to control the portable projector to output the laser beams including the regions of relaxation oscillation substantially uniformly at a ratio of about 33% ($\frac{1}{3}$) every frame of the picture, as shown in FIG. 8. In addition, the arrangement pattern generation circuit 115a is formed to generate arrangement patterns for three (n=3) frames. Thus, when the arrangement pattern generation circuit 115a is set to generate the arrangement patterns each including the laser beams including the regions of relaxation oscillation at the ratio of about 33% (1/n=⅓) per frame, the portable projector outputs the laser beams including the regions of relaxation oscillation once to every pixel in a frame period consisting of frames three (n=3) times one frame. According to the second embodiment, each arrangement pattern is so formed that the portable projector necessarily outputs the laser beams including the regions of relaxation oscillation once to all pixels in an image. One frame is an example of the "prescribed frame number" in the present invention.

According to the present invention, the memory 115b has the function of storing the arrangement patterns generated by the arrangement pattern generation circuit 115a. The pattern selection circuit 115c has a function of selecting the arrangement patterns from the memory 115b in the order of the patterns 1, 2 and 3, as shown in FIG. 9. The laser control portion 115 is formed to output laser driving current waveforms based on picture data output from a picture processing portion 11 and the arrangement patterns selected by the pattern selection circuit 115c to a laser driver 16, as shown in FIG. 7.

According to the second embodiment, as hereinabove described, the laser control portion 115 and the laser driver 16 are formed to output the laser beams including the regions of relaxation oscillation where the outputs thereof are unstabilized in initial lasing stages to partial pixels included in a plurality of image forming elements (pixels). Thus, the portable projector can reduce generation of speckle noise and suppress reduction of brightness of an image projected on a projection region with a simple structure, similarly to the portable projector 100 according to the aforementioned first embodiment.

According to the second embodiment, as hereinabove described, the laser control portion 115 and the laser driver 16 are formed to change the positions of the pixels to which the laser beams including the regions of relaxation oscillation and the laser beams including no regions of relaxation oscillation are output respectively in a picture of one frame every frame of an image (picture) consisting of a plurality of pixels on the basis of the previously set arrangement patterns. According to the second embodiment, the arrangement patterns are previously set to evenly move the positions of the pixels to which the laser beams including the regions of relaxation oscillation and the laser beams including no regions of relaxation oscillation are output respectively over the entire image, whereby the portable projector can suppress generation of speckle noise over the entire image. Thus, the portable projector can more effectively reduce generation of speckle noise over the entire image.

According to the second embodiment, as hereinabove described, the ratio of the pixels to which the laser beams including the regions of relaxation oscillation are output per frame of the image consisting of the plurality of pixels is set to ⅓, and the frame period is so formed as to consist of frames (three frames) three times one frame. Thus, pixels to which the laser beams including the regions of relaxation oscillation are output can be assigned once (⅓×3=1) to every pixel in the frame period consisting of the frames (three frames) three times one frame, whereby the portable projector can reduce generation of speckle noises on the positions of all pixels.

According to the second embodiment, as hereinabove described, the laser control portion 115 and the laser driver 16 are formed to change the positions of the pixels to which the laser beams including the regions of relaxation oscillation and the laser beams including no regions of relaxation oscillation are output respectively every frame on the basis of the arrangement patterns (patterns 1 to 3) each corresponding to the region of the size corresponding to one image consisting of a plurality of pixels. Thus, the laser control portion 115 and the laser driver 16 can easily change the positions of the pixels to which the laser beams including the regions of relaxation oscillation and the laser beams including no regions of relaxation oscillation are output respectively on the basis of the arrangement patterns (patterns 1 to 3) each corresponding to the region of the size corresponding to one image consisting of a plurality of pixels.

According to the second embodiment, as hereinabove described, the portable projector is provided with the memory 115b storing the arrangement patterns of the pixels to which the laser beams including the regions of relaxation oscillation and the laser beams including no regions of relaxation oscillation are output respectively. Thus, the portable projector can easily arrange the positions of the pixels to which the laser beams including the regions of relaxation oscillation and the laser beams including no regions of relaxation oscillation are output respectively in the previously set arrangement patterns on the basis of the arrangement patterns of the pixels to which the laser beams including the regions of relaxation oscillation and the laser beams including no regions of relaxation oscillation are output respectively.

Third Embodiment

A third embodiment of the present invention is now described with reference to FIGS. 10 and 11. A portable projector according to the third embodiment generates arrangement patterns of pixels obtained by dividing one frame into a plurality of portions and generates arrangement patterns of pixels to which laser beams including regions of relaxation oscillation and laser beams including no regions of relaxation oscillation are output respectively in one frame by linking arrangement patterns of pixels obtained by dividing one frame into a plurality of portions with each other, dissimilarly to the portable projector according to the aforementioned second embodiment generating the arrangement patterns of the pixels to which the laser beams including the regions of relaxation oscillation and the laser beams including no regions of relaxation oscillation are output respectively as to the whole of one frame of the picture.

Figures 9, 10:
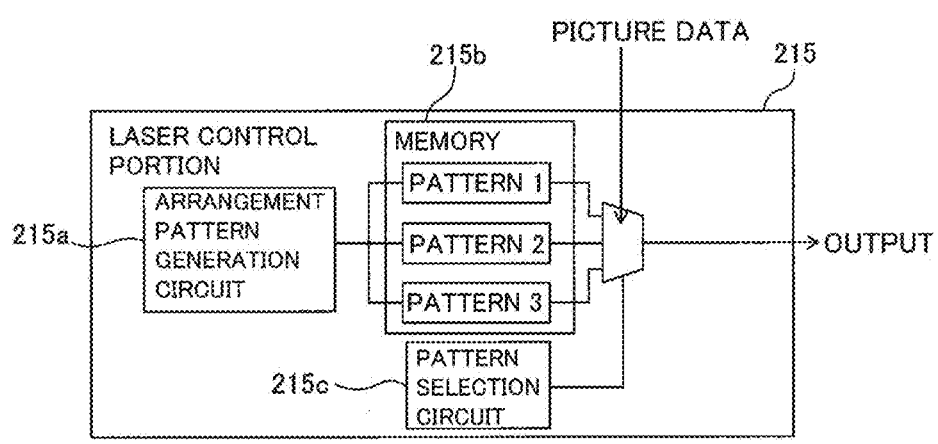
FIG. 9 is a diagram for illustrating order for selecting arrangement patterns in the portable projector according to the second embodiment of the present invention.
FIG. 10 is a block diagram showing the structure of a laser control portion of a portable projector according to a third embodiment of the present invention.

According to the third embodiment, a laser control portion 215 includes an arrangement pattern generation circuit 215a, a memory 215b storing arrangement patterns (patterns A, B and C (see FIG. 11)) generated by the arrangement pattern generation circuit 215a, and a pattern selection circuit 215c selecting the arrangement patterns from the memory 215b, as shown in FIG. 10. The laser control portion 215 is formed to change the positions of pixels to which laser beams including previously set regions of relaxation oscillation (including regions driven to reduce speckle noise) and laser beams including no regions of relaxation oscillation (including only ordinary driven regions) are output respectively every frame of a picture on the basis of arrangement patterns of pixels to which the laser beams including the regions of relaxation oscillation and the laser beams including no regions of relaxation oscillation are output respectively. The laser control portion 215 is an example of the "control portion" in the present invention. The memory 215b is an example of the "storage portion" in the present invention.

The arrangement pattern generation circuit 215a has a function of generating the arrangement patterns (see FIG. 11) of the pixels to which the laser beams including the regions of relaxation oscillation and the laser beams including no regions of relaxation oscillation are output respectively. According to the third embodiment, each arrangement pattern corresponds to a region obtained by quartering a region corresponding to one image consisting of a plurality of pixels, as shown in FIG. 11. In other words, the arrangement patterns consist of the arrangement positions of pixels to which the laser beams including the regions of relaxation oscillation and the laser beams including no regions of relaxation oscillation are output respectively in the region obtained by quartering the region corresponding to the size of one image consisting of a plurality of pixels.

Figures 11, 12:
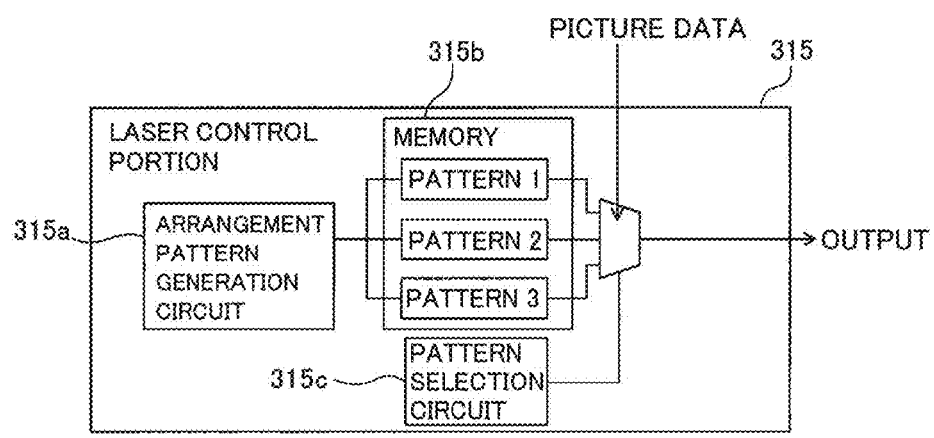
FIG. 11 is a schematic diagram for illustrating an example of reducing the storage capacity of a memory of the portable projector according to the third embodiment of the present invention.
FIG. 12 is a block diagram showing the structure of a laser control portion of a portable projector according to a fourth embodiment of the present invention.

The arrangement pattern generation circuit 215a is formed to generate patterns outputting the laser beams including the regions of relaxation oscillation at a ratio of about 33% as to a quarter of one frame, as shown in FIG. 11. The laser control portion 215 is formed to generate the arrangement patterns of the pixels to which the laser beams including the regions of relaxation oscillation and the laser beams including no regions of relaxation oscillation for one frame are output respectively by linking four arrangement patterns (arrangement patterns A, for example) generated in units of quarter frames with each other. Thus, the quantity of generated patterns is quartered, whereby the use amount of the memory 215b can be reduced.

The laser control portion 215 is formed, when set to generate arrangement patterns including the laser beams including the regions of relaxation oscillation at the ratio of about 33% (1/n=⅓), to generate arrangement patterns corresponding to three (n=3) frames of arrangement patterns formed by linking four arrangement patterns B with each other and linking four arrangement patterns C with each other, in addition to those formed by linking four arrangement patterns A with each other. In these arrangement patterns, the laser beams including the regions of relaxation oscillation are output once to every pixel in a frame period consisting of three frames.

According to the third embodiment, the memory 215b has a function of storing the arrangement patterns generated by the arrangement pattern generation circuit 215a. The pattern selection circuit 215c has a function of selecting the arrangement patterns from the memory 215b in order of the patterns A, B and C, as shown in FIG. 11. The laser control portion 215 is formed to output laser driving current waveforms based on picture data and the arrangement patterns, formed by linking four arrangement patterns (patterns A, B or C) with each other, selected by the pattern selection circuit 215c to a laser driver 16, as shown in FIG. 10.

According to the third embodiment, as hereinabove described, the laser control portion 215 and the laser driver 16 are formed to output the laser beams including the regions of relaxation oscillation where the outputs of the laser beams are unstabilized in initial lasing stages to partial pixels included in a plurality of image forming elements (pixels). Thus, the portable projector can reduce generation of speckle noise and suppress reduction of brightness of images projected on a projection region with a simple structure, similarly to the portable projectors according to the aforementioned first and second embodiments.

According to the third embodiment, as hereinabove described, the laser control portion 215 and the laser driver 16 are formed to change the positions of the pixels to which the laser beams including the regions of relaxation oscillation and the laser beams including no regions of relaxation oscillation are output respectively in an image consisting of a plurality of pixels every frame on the basis of the arrangement patterns generated by linking four arrangement patterns (A, B or C (see FIG. 11)), each corresponding to a region obtained by quartering the region corresponding to the size of one image consisting of a plurality of pixels, with each other. Thus, the laser control portion 215 and the laser driver 16 can change the positions of the pixels to which the laser beams including the regions of relaxation oscillation and the laser beams including no regions of relaxation oscillation are output respectively on the basis of the arrangement patterns (A, B or C (see FIG. 11)) having smaller data quantities than the arrangement patterns (1 to 3 (see FIG. 9) in the aforementioned second embodiment) each corresponding to the region corresponding to the size of one image. Consequently, the use amount of the memory 215b can be reduced.

Fourth Embodiment

A fourth embodiment of the present invention is now described with reference to FIGS. 1, 2 and 12 to 14. A portable projector according to the fourth embodiment generates arrangement patterns so that pixels to which laser beams including regions of relaxation oscillation are output are arranged at a higher ratio on both end portions of a picture than on a central portion in a scanning direction, dissimilarly to the portable projector according to the second embodiment substantially uniformly generating the arrangement patterns of the pixels to which the laser beams including the regions of relaxation oscillation and the laser beams including no regions of relaxation oscillation are output respectively as to each frame of the picture.

According to the fourth embodiment, a laser control portion 315 includes an arrangement pattern generation circuit 315a, a memory 315b storing arrangement patterns generated by the arrangement pattern generation circuit 315a and a pattern selection circuit 315c selecting the arrangement patterns from the memory 315b, as shown in FIG. 12. The laser control portion 315 is formed to change the positions of pixels to which the laser beams including previously set regions of relaxation oscillation and the laser beams including no regions of relaxation oscillation are output respectively every frame of a picture on the basis of the arrangement patterns of the pixels to which the laser beams including the previously set regions of relaxation oscillation (including regions driven to reduce speckle noise) and the laser beams including no regions of relaxation oscillation (including only ordinary driven regions) are output respectively. The laser control portion 315 is an example of the "control portion" in the present invention. The memory 315b is an example of the "storage portion" in the present invention.

Figure 13:
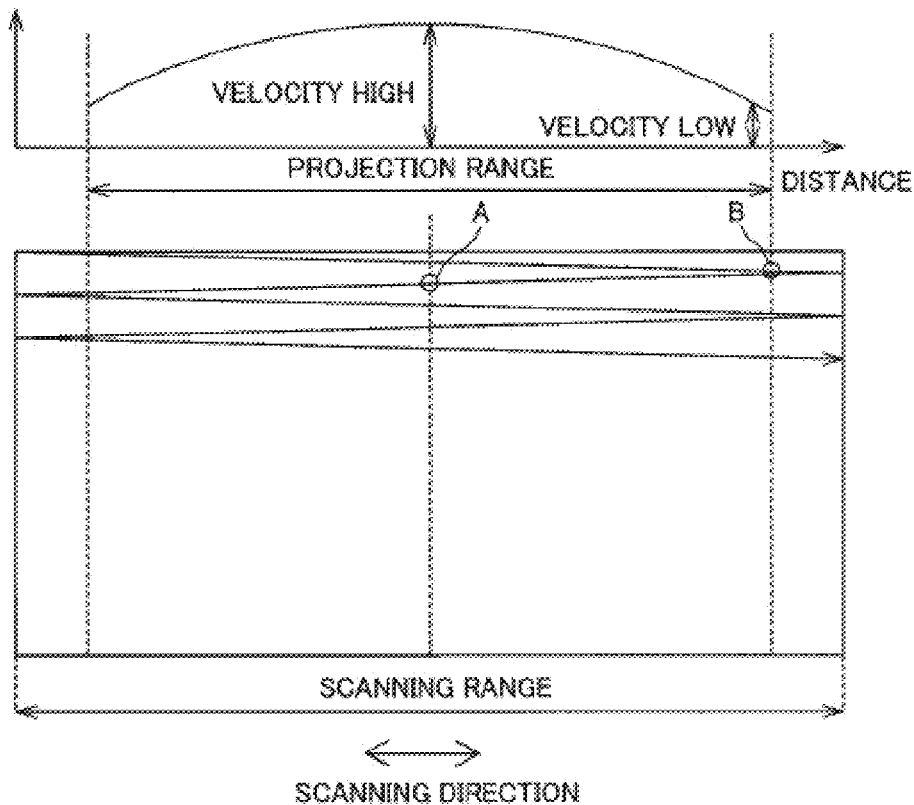
FIG. 13 is a schematic diagram for illustrating the relation between a driving range of a scanner mirror in the portable projector according to the fourth embodiment of the present invention and an angular velocity.

According to the fourth embodiment, a scanner mirror 17 (see FIG. 2) is formed to project a picture (image) consisting of a plurality of pixels (image forming elements) while changing the rate for scanning a projection region 2 with RGB laser beams, as shown in FIG. 13. More specifically, the scanner mirror 17 is so formed that an angular velocity at which the same is vibrated in the horizontal direction (direction X (see FIG. 1)) of the projection region 2 is maximized in a portion A in the vicinity of a central portion of the projection region 2 in the horizontal direction (direction X) and minimized in a portion B in the vicinity of each end portion of the projection region 2 in the horizontal direction (direction X). In other words, the scanner mirror 17 is so formed that, when the same is vibrated in the horizontal direction (direction X (see FIG. 1)) of the projection region 2, the scanning rate in the portion A in the vicinity of the central portion of the projection region 2 in the horizontal direction (direction X) is larger than that in the portion B in the vicinity of each end portion of the projection region 2 in the horizontal direction (direction X).

Figure 14:
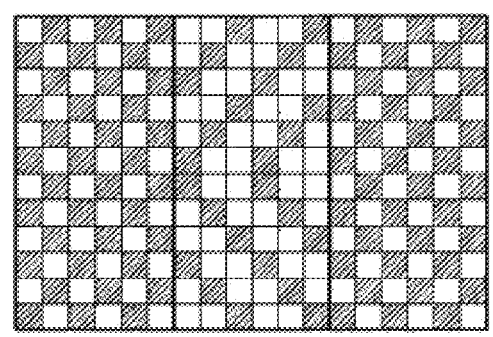
FIG. 14 is a schematic diagram for illustrating arrangement patterns in a case where the ratios of laser beams including regions of relaxation oscillation vary with a scanning direction in the portable projector according to the fourth embodiment of the present invention.

The arrangement pattern generation circuit 315a has a function of generating arrangement patterns (see FIG. 14) of the pixels to which the laser beams including the regions of relaxation oscillation and the laser beams including no regions of relaxation oscillation are output respectively, as shown in FIG. 12. Further, the arrangement pattern generation circuit 315a is formed to output the laser beams including the regions of relaxation oscillation at a ratio of about 33% (⅓) to pixels of a central portion obtained by dividing one frame into three portions in the scanning direction, as shown in FIG. 14. In addition, the arrangement pattern generation circuit 315a is formed to output the laser beams including the regions of relaxation oscillation at a ratio of about 50% (½) to pixels on both end portions obtained by dividing one frame into three portions in the scanning direction.

According to the fourth embodiment, as hereinabove described, the laser control portion 315 and a laser driver 16 are formed to output the laser beams including the regions of relaxation oscillation where the outputs of the laser beams are unstabilized in initial lasing stages to partial pixels included in a plurality of image forming elements (pixels). Thus, the portable projector can reduce generation of speckle noise and suppress reduction of brightness of images projected on a projection region with a simple structure, similarly to the portable projectors according to the aforementioned first to third embodiments.

According to the fourth embodiment, as hereinabove described, the portable projector is so formed that the pixels to which the laser beams including the regions of relaxation oscillation are output are arranged at a higher ratio on both end portions of the picture in the scanning direction than on the central portion in the scanning direction. The scanning rate is smaller on both end portions in the scanning direction than on the central portion in the scanning direction, whereby the quantities of the laser beams output to both end portions in the scanning direction are larger than those of the laser beams output to the central portion in the scanning direction. When the portable projector is so formed in this case that the pixels to which the laser beams including the regions of relaxation oscillation are output are arranged at a higher ratio on both end portions in the scanning direction than on the central portion in the scanning direction, the portable projector can sufficiently ensure brightness while sufficiently reducing generation of speckle noise on both end portions in the scanning direction.

Fifth Embodiment

A fifth embodiment of the present invention is now described with reference to FIGS. 2, 4, 5, 15 and 16. A portable projector according to the fifth embodiment outputs laser beams including regions of relaxation oscillation every color of the laser beams, dissimilarly to the portable projector 100 according to the first embodiment outputting the laser beams to include the regions of relaxation oscillation in all of the red LD 12, the blue LD 13 and the green LD 14 regardless of the colors of the laser beams when outputting the laser beams including the regions of relaxation oscillation.

Figure 15:
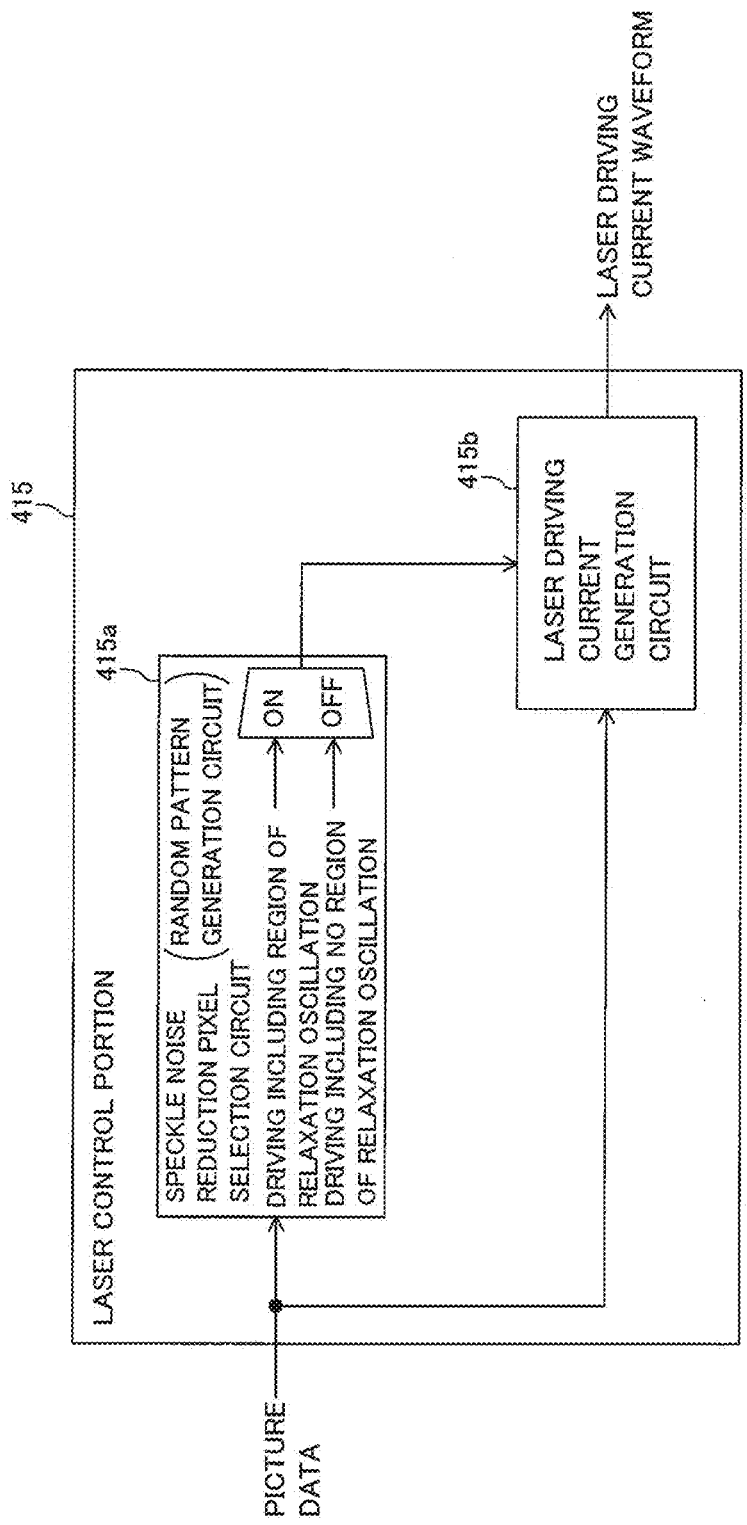
FIG. 15 is a block diagram showing the structure of a laser control portion of a portable projector according to a fifth embodiment of the present invention.

According to the fifth embodiment, a laser control circuit 415 includes a speckle noise reduction pixel selection circuit 415a and a laser driving current generation circuit 415b, as shown in FIG. 15. The speckle noise reduction pixel selection circuit 415a has a function of selectively outputting either laser beams including regions of relaxation oscillation or laser beams including no regions of relaxation oscillation to prescribed pixels in a picture. Further, the speckle noise reduction pixel selection circuit 415a is formed to output the laser beams including the regions of relaxation oscillation as to each of red LD 12, a blue LD 13 and a green LD 14 correspondingly to picture data, as shown in FIG. 16.

The green LD 14 most easily generating speckle noise, the red LD 12 secondly easily generating speckle noise and the blue LD 13 most hardly generating speckle noise output laser beams including regions of relaxation oscillation in this order. In other words, the portable projector according to the fifth embodiment is so formed that the green LD 14 outputs laser beams including regions of relaxation oscillation in the range of ratios of 50% to 100%. Further, the portable projector is so formed that the red LD 12 outputs laser beams including regions of relaxation oscillation in the range of ratios of 30% to 80%. In addition, the portable projector is so formed that the blue LD 13 outputs laser beams including regions of relaxation oscillation in the range of ratios of 0% to 50%.

According to the fifth embodiment, the green LD 14, the red LD 12 and the blue LD 13 emit the laser beams including the regions of relaxation oscillation so that the outputs thereof are larger than those of laser beams including no regions of relaxation oscillation. More specifically, current for outputting the laser beams including the regions of relaxation oscillation is adjusted to be large, so that an area S1 (shown by slant lines in FIG. 4) surrounded by output current and time in FIG. 4 is identical to an area S2 (shown by slant lines in FIG. 5) surrounded by output current and time in FIG. 5. Thus, the portable projector can ensure a sufficient quantity of light also in the case of outputting the laser beams including the regions of relaxation oscillation, as compared with the case of outputting the laser beams including no regions of relaxation oscillation.

According to the fifth embodiment, as hereinabove described, the laser control portion 415 and a laser driver 16 are formed to output the laser beams including the regions of relaxation oscillation where the outputs of the laser beams are unstabilized in initial lasing stages to partial pixels included in a plurality of image forming elements (pixels). Thus, the portable projector can reduce generation of speckle noise and suppress reduction of brightness of an image projected on a projection region with a simple structure, similarly to the portable projectors according to the aforementioned first to fourth embodiments.

According to the fifth embodiment, as hereinabove described, the laser control portion 415 and the laser driver 16 are so formed that the laser control portion 415 increases the ratios of pixels corresponding to the laser beams including the regions of relaxation oscillation in the order of the blue LD 13, the red LD 12 and the green LD 14. Thus, the ratio of the pixels to which the laser beams including the regions of relaxation oscillation are output can be reduced in relation to the blue LD 13 hardly generating speckle noise while the ratio of the pixels to which the laser beams including the regions of relaxation oscillation are output can be increased in relation to the green LD 14 easily generating speckle noise, whereby the portable projector can efficiently reduce generation of speckle noise in response to the colors of the laser beams.

Although the present invention has been described and illustrated in detail, it is clearly understood that the same is by way of illustration and example only and is not to be taken by way of limitation, the spirit and scope of the present invention being limited only by the terms of the appended claims.

For example, while the present invention is applied to the portable projector as the example of the display according to the present invention in each of the aforementioned first to fifth embodiments, the present invention is not restricted to this. The present invention is also applicable to a display such as a stationary laser projector, for example, so far as the same outputs laser beams.

While the portable projector changes the positions of the pixels every frame in each of the aforementioned first to fifth embodiments, the present invention is not restricted to this. According to the present invention, the portable projector may alternatively change the positions of the pixels every plurality of frames, for example.

While the ratio of the pixels to which the laser beams including the regions of relaxation oscillation are output is set to about 33% (⅓) in each of the aforementioned first to fourth embodiments, the present invention is not restricted to this. According to the present invention, the ratio of the pixels to which the laser beams including the regions of relaxation oscillation are output can be set to any ratio, so far as the same is larger than 0% and smaller than 100%.

While the ratio of the pixels to which the laser beams including the regions of relaxation oscillation are output is set to about 33% (⅓) and three types of patterns are generated in each of the aforementioned second to fourth embodiments, the present invention is not restricted to this. According to the present invention, n may be a value other than three, so far as the portable projector generates n types of patterns when the ratio of pixels to which laser beams including regions of relaxation oscillation are output is 1/n.

While the portable projector generates arrangement patterns as to the quarter of one frame in the aforementioned third embodiment, the present invention is not restricted to this. The portable projector may not generate arrangement patterns in units of quarter frames, so far as the same generates arrangement patterns by dividing one frame.

While the portable projector divides one frame into three portions in the scanning direction and varies the ratios of the pixels to which the laser beams including the regions of relaxation oscillation are output with the divided portions in the aforementioned fifth embodiment, the present invention is not restricted to this. The portable projector may alternatively divide one frame into four or more portions in the scanning direction and vary the ratios of the pixels to which the laser beams including the regions of relaxation oscillation are output with the divided portions.

While the scanner mirror which is a vibrative miniature vibrating element is employed as a projection portion in each the aforementioned first to fifth embodiments, the present invention is not restricted to this. Alternatively, a member other than the mirror element may be employed, so far as the same can scan the projection region with laser beams.

While the portable projector projects the RGB laser beams onto the projection region 2 by employing the red LD 12, the blue LD 13 and the green LD 14 as laser beam generation portions in each the aforementioned first to fifth embodiments, the present invention is not restricted to this. Alternatively, a laser beam generation portion may be formed to generate RGB laser beams from one LD (laser diode). Further alternatively, a laser beam generation portion may be formed to generate only monochromatic laser beams, or may be formed to generate laser beams of at least two or four colors.

While the red LD 12, the blue LD 13 and the green LD 14 are provided one by one to output the RGB laser beams in each the aforementioned first to fifth embodiments, the present invention is not restricted to this. According to the present invention, the portable projector may be provided with a plurality of LDs of at least red, blue or green, to output RGB laser beams. For example, the portable projector may be provided with two green LDs alone, to output laser beams as RGB laser beams.

While the portable projector drives the single scanner mirror 17 on the X- and Y-axes thereby scanning the projection region 2 with the laser beams in the directions X and Y by driving the laser beams on the X- and Y-axis with only the single scanner mirror 17 in each the aforementioned first to fifth embodiments, the present invention is not restricted to this. According to the present invention, the portable projector may alternatively be provided with two mirrors, i.e., a Y-axis driving mirror driving laser beams on a Y axis thereby scanning a projection region with the laser beams in a direction X and an X-axis driving mirror driving the laser beams on an X axis thereby scanning the projection region with the laser beams in a direction Y for scanning the projection region with the laser beams in the directions X and Y.

While the portable projector projects the picture received from the personal computer through the picture input interface onto the projection region in each the aforementioned first to fifth embodiments, the present invention is not restricted to this. Alternatively, the portable projector may receive a picture by a method, such as that of receiving picture data stored in a memory card through a card slot and projecting the received picture onto a projection region, for example, other than the signal input from an external apparatus.

What is claimed is:
1. A projector comprising:
a laser beam generation portion outputting laser beams;
a projection portion projecting an image; and
a control portion controlling said laser beam generation portion to output a first laser beam including a region of relaxation oscillation and to output a second laser beam including no said region of relaxation oscillation,
wherein said control portion is formed to operate supplying current higher than lasing threshold current and reducing the current to a level less than said lasing threshold current when outputting said first laser beam and is formed to continuously supply said current higher than said lasing threshold current when outputting said second laser beam.
2. The projector according to claim 1, wherein
a period when outputs of said laser beams are stabilized after relaxation oscillation is set to be longer than a prescribed period of relaxation oscillation in a period from starting supplying current higher than said lasing threshold current to reducing the current to the level less than said lasing threshold current.
3. The projector according to claim 1, wherein
said control portion is formed to stop outputting said laser beams by reducing the current to said level less than said lasing threshold current once every pixel when outputting said first laser beam.
4. The projector according to claim 1, wherein
said laser beam generation portion emits said first laser beam so that an output of said first laser beam is larger than an output of said second laser beam.

5. The projector according to claim 4, wherein
the current for outputting said first laser beam is adjusted to be large than current for outputting said second laser beam, so that an area surrounded by output current and time when outputting said first laser beam is substantially identical to an area surrounded by output current and time when outputting said second laser beam.

6. The projector according to claim 1, wherein
said region of relaxation oscillation is an unstabilized region in an initial lasing stage.

7. The projector according to claim 1, wherein
said laser beam generation portion includes a red laser beam generation portion outputting a red laser beam, a green laser beam generation portion outputting a green laser beam and a blue laser beam generation portion outputting a blue laser beam, and
said control portion is formed to operate supplying current higher than said lasing threshold current to said red laser beam generation portion, said blue laser beam generation portion and said green laser beam generation portion and reducing the current to a level less than said lasing threshold current when outputting said first laser beam,
said control portion is formed to continuously supply the current higher than said lasing threshold current to said red laser beam generation portion, said blue laser beam generation portion and said green laser beam generation portion when outputting said second laser beam.

8. The projector according to claim 1, wherein
said control portion is formed to change the positions of a first image forming element to which said first laser beam is outputted and a second image forming element to which said second laser beam is outputted in said image formed by a plurality of image forming elements every prescribed frame number of said image formed by said plurality of image forming elements.

9. The projector according to claim 8, wherein
said control portion is formed to select randomly the positions that said first laser beam or said second laser beam is outputted in said image formed by said plurality of image forming elements every said prescribed frame number of said image formed by said plurality of image forming elements.

10. The projector according to claim 9, wherein
said control portion is formed to repeat a series of cycles performing processing of randomly selecting and changing the positions of said first image forming element and said second image forming element in said image every said prescribed frame number over a period consisting of frames of n times said prescribed frame number when the ratio of said first image forming element per frame of said image formed by said first image forming element and said second image forming element whose positions have been randomly selected is 1/n.

11. The projector according to claim 8, wherein
said control portion is formed to change the positions of said first image forming element and said second image forming element in said image formed by said plurality of image forming elements every said prescribed frame number of said image formed by said plurality of image forming elements on the basis of a previously set prescribed arrangement pattern.

12. The projector according to claim 11, wherein
said arrangement pattern is so formed that said control portion changes the positions of said first image forming element and said second image forming element so that said laser beam generation portion outputs said first laser beam to each of said plurality of image forming elements at least once during a frame period consisting of frames of a plurality of times said prescribed frame number.

13. The projector according to claim 12, wherein
said frame period is a frame period consisting of frames of at least n times said prescribed frame number when the ratio of said first image forming element per frame in said arrangement pattern of said first image forming element and said second image forming element is 1/n.

14. The projector according to claim 13, wherein
said frame period is a frame period consisting of frames of n times said prescribed frame number.

15. The projector according to claim 11, wherein
said control portion is formed to change the positions of said first image forming element and said second image forming element in said image formed by said plurality of image forming elements every said prescribed frame on the basis of said prescribed arrangement pattern consisting of arrangement positions of said first image forming element and said second image forming element in a region of a size corresponding to one said image formed by said plurality of image forming elements.

16. The projector according to claim 11, wherein
said control portion is formed to change the positions of said first image forming element and said second image forming element in said image formed by said plurality of image forming elements every said prescribed frame on the basis of an arrangement pattern formed by connecting a plurality of said prescribed arrangement patterns consisting of arrangement positions of said first image forming element and said second image forming element in a region obtained by dividing said region of said size corresponding to one said image formed by said plurality of image forming elements.

17. The projector according to claim 11, wherein
said arrangement pattern of said first image forming element and said second image forming element is so formed that the ratio of arrangement of said first image forming element is higher on both end portions of said image consisting of said image forming elements in a scanning direction than on a central portion in said scanning direction.

18. The projector according to claim 11, further comprising a storage portion storing said arrangement pattern of said first image forming element and said second image forming element.

19. The projector according to claim 8, wherein
said prescribed frame number of said image formed by said plurality of image forming elements is one.

20. The projector according to claim 8, wherein
said laser beam generation portion includes a red laser beam generation portion outputting a red laser beam, a green laser beam generation portion outputting a green laser beam and a blue laser beam generation portion outputting a blue laser beam, and
said control portion is formed to increase the ratio of said first image forming element to which said first laser beam is outputted including said region of relaxation oscillation in order of said blue laser beam generation portion, said red laser beam generation portion and said green laser beam generation portion.

* * * * *